United States Patent [19]
Takeuchi

[11] Patent Number: 5,661,056
[45] Date of Patent: Aug. 26, 1997

[54] NON-VOLATILE SEMICONDUCTOR MEMORY DEVICE AND METHOD OF MANUFACTURING THE SAME

[75] Inventor: Nobuyoshi Takeuchi, Tokyo, Japan

[73] Assignees: NKK Corporation, Tokyo, Japan; Macronix International Co., Ltd., Hsinchu, Taiwan

[21] Appl. No.: 533,169

[22] Filed: Sep. 25, 1995

[30]   Foreign Application Priority Data

Sep. 29, 1994  [JP]  Japan ................................ 6-259009
Sep. 18, 1995  [JP]  Japan ................................ 7-237959

[51] Int. Cl.$^6$ ............................................. H01L 21/8247
[52] U.S. Cl. ..................... 438/261; 438/591; 438/954
[58] Field of Search ...................... 437/43, 52, 978

[56]        References Cited

U.S. PATENT DOCUMENTS

| | | | |
|---|---|---|---|
| 5,045,488 | 9/1991 | Yeh | 437/43 |
| 5,158,902 | 10/1992 | Hanada | 437/43 |
| 5,445,981 | 8/1995 | Lee | 437/43 |
| 5,460,992 | 10/1995 | Hasegawa | 437/43 |
| 5,470,771 | 11/1995 | Fujii et al. | 437/43 |

FOREIGN PATENT DOCUMENTS

| | | |
|---|---|---|
| 0 383 011 A2 | 8/1990 | European Pat. Off. . |
| 3-57279 | 3/1991 | Japan . |
| 5-267684 | 3/1992 | Japan . |
| 6-90008 | 5/1992 | Japan . |
| 6-77493 | 8/1992 | Japan . |
| 6-77497 | 8/1992 | Japan . |

OTHER PUBLICATIONS

C. S. Lai et al., "The Electrical characteristics of Polysilicon Oxide Grown in Pure $N_2O$", IEEE Electron Device Letters, vol. 16, No. 9, Sep. 1995.
S. Chiang et al; "Antifuse Structure Comparison for Field Programmable Gate Arrays", IEDM 92, pp. 611–614, 1992, month unknown.
Y. Okada et al., "Furnace Grown Gate Oxynitride Using Nitric Oxide (NO)", IEEE Transactions on Electron Devices, vol. 41, No. 9, Sep. 1994.
S. Mori et al., "Bottom–Oxide Scaling for Thin Nitride/Oxide Interpoly Dielectric in Stacked–Gate Nonvolatile Memory Cells", IEEE Transactions on Electron Devices, vol. 39, No. 2., Feb. 1992.

Primary Examiner—John Niebling
Assistant Examiner—Richard A. Booth

[57]            ABSTRACT

A tunnel oxide film is formed on the surface of a p-type silicon substrate, and a floating gate electrode made from a polysilicon film is formed on the surface of the tunnel oxide film. On the surface of the floating gate electrode, a control gate electrode is formed via an NON film formed by sequentially stacking a silicon nitride film, a silicon oxide film, and a silicon nitride film. A side oxide film is formed on the side surfaces of the floating gate electrode and the control gate electrode. Source and drain regions made from an n-type diffused layer are formed on the surfaces of element regions of the silicon substrate on the two sides of the floating gate electrodes.

7 Claims, 5 Drawing Sheets

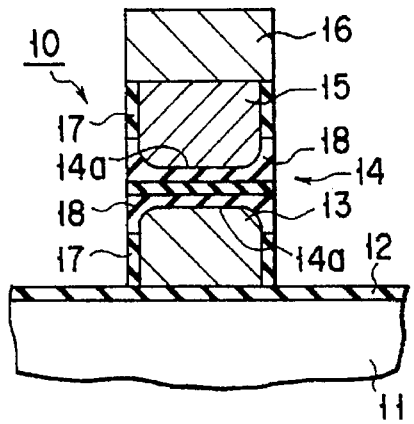
F I G. 1
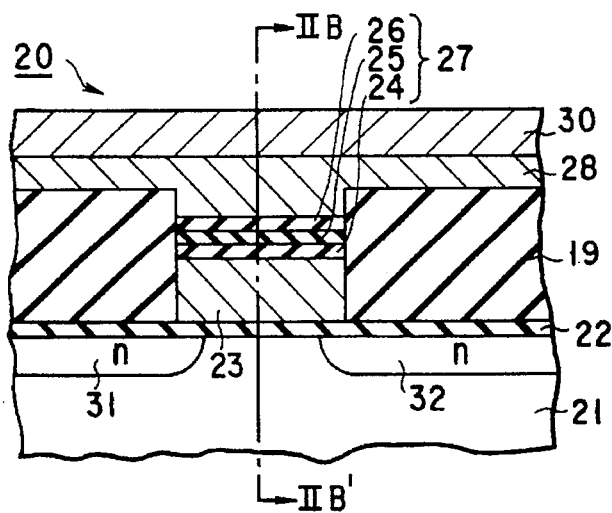
F I G. 2A
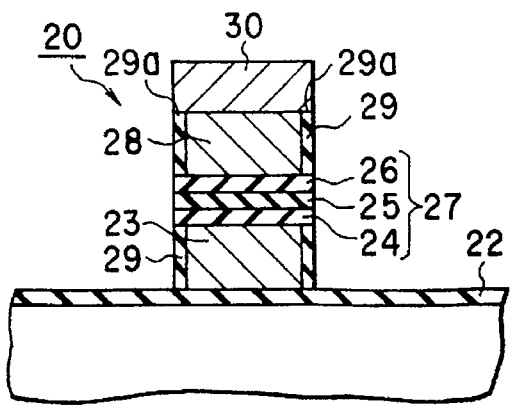
F I G. 2B

NON-VOLATILE SEMICONDUCTOR MEMORY DEVICE AND METHOD OF MANUFACTURING THE SAME

BACKGROUND OF THE INVENTION

1. Field of the Invention

The present invention relates to a non-volatile semiconductor memory device. The present invention also relates to a method of manufacturing a non-volatile semiconductor memory device.

2. Description of the Related Art

In conventional stacked non-volatile semiconductor memory devices, an insulating film (to be referred to as a second gate insulating film hereinafter) for insulating a floating gate and a control gate from each other is a single layer of silicon oxide. Recently, semiconductor devices tend to be miniaturized more and more, and in this situation the thickness of the second gate insulating film is required to further decrease.

To meet this requirement, a second gate insulating film, a so-called "ONO film", having a stacked structure consisting of a silicon oxide film/a silicon nitride film/a silicon oxide film, is used instead of a single film of silicon oxide. The ONO film has a good withstand voltage characteristic even with a relatively thin film thickness. Also, a retention characteristic of the memory cell having the ONO film is improved.

IEEE Electron Device Vol. 39, No. 2, 1992, p. 283–291 has proposed a structure, a so-called "NO film", consisting of a silicon nitride film/a silicon oxide film, in order to further decrease the thickness of the second gate insulating film.

A non-volatile semiconductor memory device using the second gate insulating film with the above stacked structure is manufactured as follows. As illustrated in FIG. 1, on the surface of a tunnel oxide film 12 formed on the surface of a silicon substrate 11, a first polysilicon film 13 as a floating gate, an ONO film 14, a second polysilicon film 15 as a control gate, and a tungsten silicide film 16 are stacked in this order. The resultant stacked structure is patterned into a memory cell 10 in accordance with a conventional method. Thereafter, thermal oxidation is performed to form side oxide layers 17 on the side surfaces of the first and second polysilicon films 13 and 15 of the memory cell 10.

In the memory cell 10 using the ONO film 14, a silicon oxide film 14a is in direct contact with the first and second polysilicon films 13 and 15. In the method described above, therefore, when the side oxide layers 17 are formed by thermal oxidation, the silicon oxide films 14a grow inward along the interface between the silicon oxide films 14a and polysilicon films 13 and 15, at the end portion of the ONO film 14, thereby forming so-called gate birds' beaks 18, as in FIG. 1. This gate birds' beaks 18 increase the effective thickness of the ONO film 14 and decrease the coupling ratio of the memory cell 10. Accordingly, to ensure the effective applied voltage to the memory cell 10, it is necessary to raise the applied voltage to the control gate. Such a raise in the applied voltage, results in a heavy load on a voltage generating circuit and less reliability of the second gate insulating film. This problem is similarly found in the case of the NO film.

One conventional approach to eliminate this problem is, as disclosed in Jpn. Pat. Appln. KOKAI Publication No. 3-57279, to form an oxidation-resistant film, such as a silicon nitride film, in place of the side oxide film 17, thereby preventing the formation of the gate birds' beak 18. Unfortunately, the formation of this kind of a film is impractical because, it makes the manufacturing process extremely complicated.

SUMMARY OF THE INVENTION

It is an object of the present invention to provide a non-volatile semiconductor memory device capable of reducing the formation of a birds' beak and a method of manufacturing the device.

To achieve the above object, the present invention provides a non-volatile semiconductor memory device comprising: source and drain regions formed apart from each other on a semiconductor substrate of one conductivity type and having a conductivity type opposite to the conductivity type of the semiconductor substrate; a first gate insulating film formed on a channel region between the source and drain regions; a floating gate electrode formed on the first gate insulating film; a second gate insulating film formed on the floating gate electrode, the second gate insulating film having Si-N bonds at an interface with the floating gate electrode and at an interface with a control gate electrode; the control gate electrode formed on the second gate insulating film; and a side insulating film formed to cover side wall surfaces of the floating gate electrode, and the control gate electrode.

Further, the present invention provides a method of manufacturing a non-volatile semiconductor memory device, comprising the steps of: forming a first gate insulating film on a semiconductor substrate having one conductivity type; forming a first polysilicon film on the first gate insulating film; forming a second gate insulating film on the first polysilicon film, the second gate insulating film having Si-N bonds at an interface with a floating gate electrode and at an interface with a control gate electrode; forming a second polysilicon film on the second gate insulating film; patterning the first polysilicon film, the second gate insulating film, and the second polysilicon film to form on the first gate insulating film, and the control gate electrode over the floating gate electrode; doping impurities into element regions of the semiconductor substrate on two sides of the floating gate electrode to form source and drain regions having a conductivity type opposite to the conductivity type of the semiconductor substrate; and forming a side insulating film on side surfaces of the floating gate electrode and the control gate electrode.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a sectional view showing a conventional non-volatile semiconductor memory device;

FIG. 2A is a sectional view showing one embodiment of a non-volatile semiconductor memory device according to the present invention and FIG. 2B is a sectional view a corresponding to the line IIB–IIB' in FIG. 2A;

DETAILED DESCRIPTION OF THE PREFERRED EMBODIMENTS

Figure 3A:
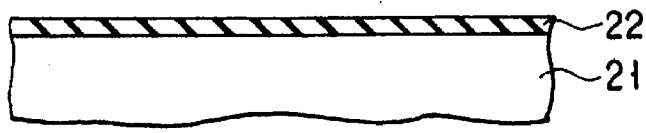
FIGS. 3A to 3D are sectional views showing the individual steps of a method of manufacturing a non-volatile semiconductor memory device of the first embodiment.

The present invention will be described in more detail below.

The characteristic features of a non-volatile semiconductor memory device of the present invention are as follows. A second gate insulating film for insulating a floating gate and a control gate from each other has Si-N bonds at, on or in the interfaces with the floating gate and the control gate respectively. Assuming the layer of this second gate insulating film in contact with the floating gate and the control gate is represented by SiN, the second gate insulating film is made of an NON film consisting of SiN/silicon oxide ($SiO_2$)/SiN.

SiN is most commonly a silicon nitride film formed by low-pressure CVD. The dielectric constant of this silicon nitride film is approximately twice that of the silicon oxide film. Accordingly, the thickness of the NON film is approximately 1.5 times in order to obtain the dielectric constant of a single film of silicon oxide. To obtain a film having the same dielectric constant by using a conventional ONO film, the ONO film must be uniformly formed to have a thickness smaller than that of an oxide film. In contrast, the NON film of the present invention can be formed with a larger thickness than that of the ONO film, so the non-volatile semiconductor memory device having this NON film is easily manufactured and therefore advantageous in mass-production.

The other example of SiN is a silicon oxide film having Si-N bonds at, on or in the interface with polysilicon. When a polysilicon layer is oxynitrized by thermal-treatment in an $N_2O$ or NO atmosphere, nitrogen atoms concentrate at the interface between the polysilicon layer and a silicon oxide layer thus obtained, as described in IEEE TRANSACTIONS ON ELECTRON DEVICE, VOL. 41, NO. 9, SEPTEMBER, 1994. It is called as "pile up" that nitrogen atoms concentrate at the interface between the polysilicon layer and the silicon oxide layer. Therefore, a silicon oxide film having Si-N bonds at, on or in the interface with polysilicon is equal to a silicon oxide film piled up nitrogen atoms. A concentration of nitrogen atoms in the silicon oxide film having Si-N bonds at the interface with polysilicon is, for example, 0.5 atom % or more than, preferably, 1.0 atom % or more.

In the method for manufacturing the non-volatile semiconductor memory device of the present invention, it is possible by using the conventional film formation techniques to form the NON film, i.e., the Si-N bonds at the interface between the second gate insulating film and the floating gate electrode and at the interface between the second gate insulating film and the control gate electrode. The following film formation methods are such conventional examples.

(1) A silicon nitride film is formed on the surface of a polysilicon film as a floating gate by low-pressure CVD using $SiH_2Cl_2$ gas and $NH_3$ gas as source gases. A silicon oxide film is then formed on the silicon nitride film by CVD using $SiH_4$ gas and $N_2O$ gas as source gases. Finally, a silicon nitride film is formed on the silicon oxide film by low-pressure CVD using $SiH_2Cl_2$ gas and $NH_3$ gas as source gases.

(2) A silicon nitride film is formed on a polysilicon film as a floating gate by performing RTN (Rapid Thermal Nitrization) in a nitrogen or ammonia atmosphere. Oxidation is then performed to convert the silicon nitride film into silicon oxide, thereby forming a silicon oxide film. A silicon nitride film is then formed on the silicon oxide film by low-pressure CVD or RTN.

(3) A silicon nitride film is formed by low-pressure CVD on the surface of a polysilicon film as a floating gate. The silicon nitride film is then oxidized to form a silicon oxide film. Finally, a silicon nitride film is formed by low-pressure CVD.

(4) A silicon nitride film is formed by low-pressure CVD on the surface of a polysilicon film as a floating gate. To form a silicon oxide film on the silicon nitride film, silicon oxide is deposited on the surface of the silicon nitride film and then the silicon nitride film is oxidized. Alternatively, after the silicon nitride film is oxidized, silicon oxide is deposited on the silicon nitride film by CVD. Finally, a silicon nitride film is formed on the silicon oxide film by low-pressure CVD or by annealing using a lamp in a nitrogen atmosphere.

(5) By annealing polysilicon using $N_2O$ gas and NO gas, a silicon oxide film to which nitrogen atoms are piled up at the Si-$SiO_2$ interface is obtained. This interface containing Si-N bonds is hardly oxidized when oxidation is performed later. Therefore, a silicon oxide film formed by thermal oxidation of polysilicon in an $N_2O$ or NO atmosphere can be used to suppress formation of a gate birds' beak. More specifically, the polysilicon of the floating gate is annealed in $N_2O$ gas to form a silicon oxide film having Si-N bonds at the interface with the polysilicon, in other words, a silicon oxide film (to be referred to as silicon oxynitride film) piled up nitrogen atoms, on the polysilicon. Thereafter, a silicon nitride film is formed by low-pressure CVD on the silicon oxynitride film. As a result, a second gate oxide film consisting of silicon oxynitride and silicon nitride. In this case, the gate oxide film has Si-N bonds at the interface with the floating gate and the control gate respectively.

(6) A polysilicon as a floating gate is annealed in an $N_2O$ gas atmosphere to form a silicon oxide film having Si-N bonds on the interface with the floating gate, i.e., a silicon oxynitride film. A silicon nitride film is then formed by low-pressure CVD on the silicon oxynitride film. Subsequently, a silicon oxide film is formed on the silicon nitride film by CVD. Thereafter, a silicon nitride film is formed by low-pressure CVD or by annealing using a lamp in a nitrogen atmosphere. As a result, a second gate insulating film consisting of silicon oxynitride/silicon nitride/ silicon oxide/silicon nitride is formed.

(7) In method (5) or (6) described above, NO is used instead of $N_2O$.

(8) A silicon oxide film is formed on a polysilicon film as a floating gate. The silicon oxide film is annealed in an $N_2O$ gas atmosphere, thereby piling up nitrogen atoms to the silicon oxide film. A silicon nitride film is then formed on the silicon oxynitride obtained by low-pressure CVD or by annealing using a lamp in a nitrogen atmosphere. As a result, a second gate insulating layer consisting of silicon oxynitride and silicon nitride is formed.

(9) In method (8) described above, NO is used instead of $N_2O$.

(10) $Si_3N_4$, $SiO_2$, $Si_3N_4$, $SiO_2$ and $Si_3N_4$ are sequentially deposited by low-pressure CVD on the surface of a polysilicon film as a floating gate and a $SiN/SiO_2/SiN/SiO_2/SiN$-structure is formed. Alternatively, the polysilicon film as a floating gate is oxynitrized in an $N_2O$ or NO atmosphere. On the silicon oxynitride thus obtained, $Si_3N_4$, $SiO_2$ and $Si_3N_4$ are sequentially deposited. Finally, a $SiN/SiO_2/SiN/SiO_2/SiN$-structure is formed.

As described above, in order to form the $SiN/SiO_2/SiN/SiO_2/SiN$-structure, the following steps can be performed. A $SiN/SiO_2/SiN$-structure of the lower layer thereof is formed according to any one of the methods (1)–(5) described above, and then, a $SiO_2$ film and a SiN film is formed.

After formation of NON layer, a $SiO_2$ film and a SiN film are formed in the following processes.

(a) $SiO_2$ and $Si_3N_4$ are sequentially deposited by low-pressure CVD.

(b) A $SiO_2$ film is formed on the SiN film of the uppermost layer of the $SiN/SiO_2/SiN$-structure by thermal oxidization in the presence of such as $O_2$, $O_2/H_2$, $N_2O$ and NO, more specifically, by RTP. Thereafter, $Si_3N_4$ is deposited by low-pressure CVD on the $SiO_2$ film.

(c) The main surface of the SiN film is thermally oxidized in the same manner as step (b) to form a $SiO_2$ film on the $SiN/SiO_2/SiN$-structure. Then, the $SiO_2$ film is nitrized again by thermally nitrization, more specifically, by RTP, thereby forming a SiN film.

(11) A SiN film is formed by low-pressure CVD on the surface of a polysilicon film as a floating gate. Subsequently, $Si_xO_yN_z$ is deposited on the SiN film by plasma CVD. Thereafter, a SiN film is formed by low-pressure CVD on the $Si_xO_yN_z$ film. As a result, $SiN/Si_xO_yN_z/SiN$-structure is formed. Alternatively, the polysilicon film as the floating gate is oxynitrized, thereby a silicon nitride film having Si-N bonds at the interface with the polysilicon film is formed. Thereafter, $Si_xO_yN_z$ is deposited by plasma CVD. Subsequently, a SiN film is formed by low-pressure CVD or thermal nitrization on the $Si_xO_yN_z$ film. As a result, the $SiN/Si_xO_yN_z/SiN$-structure is formed.

(12) According to the above methods, the SiN film, $SiO_2$ film and SiN film are formed in independent steps in order to form the $SiN/SiO_2/SiN$-structure. These films can be sequentially formed. At least one of object to be processed is loaded and placed in a furnace for low-pressure CVD, a source gas such as $NH_3/SiH_4$ gas for formation of a $Si_3N_4$ film is introduced into the furnace and a $Si_3N_4$ film is formed on the object. Sequentially, the source gas in the furnace is substituted for source gases such as $N_2O/SiH_4$ gas and $N_2O/SiH_2Cl_2$ gas for formation of a $SiO_2$ film and the $SiO_2$ film is formed on the $Si_3N_4$ film. Further, the source gases in the furnace are substituted for a source gas for formation of a $Si_3N_4$ film and the $Si_3N_4$ film is formed on the $SiO_2$ film.

When a $Si_xO_yN_z$ film is formed in place of the $SiO_2$ film, a source gas such as $NH_3/N_2O/SiH_4$ gas for formation of the $Si_xO_yN_z$ film may be used in place of a source gas for formation of the $SiO_2$ film in the above methods. Preferably, however, formation of the $Si_xO_yN_z$ film may be performed by plasma CVD since the processing temperature is lowered.

Further, $N_2O$ gas or NO gas may be first introduced into a furnace, the object may be thermally oxidized to form a silicon oxynitrized film, and thereafter, the gas in the furnace may be substituted by the source gas for formation of the $Si_3N_4$ film to form the $Si_3N_4$ film.

According to the method explained above, in the $SiN/SiO_2/SiN$-structure, the respective films are not independent of each other or non-sequential, but the compositions vary sequentially in order of SiN, $SiO_2$ and SiN.

As described above, the SiN film contains the silicon nitride, the silicon oxide film having Si-N bonds at the interface with polysilicon, and, the $Si_xO_yN_z$ film. Therefore, it is not necessarily that Si-N bonds exist in all of the SiN film. Si-N bonds can exist only at the interface between the SiN film and the polysilicon film.

Preferred embodiments of the non-volatile semiconductor memory device of the present invention will be described below.

FIG. 2A is a sectional view showing one embodiment of the non-volatile semiconductor memory device of the present invention and FIG. 2B is a sectional view corresponding to the line IIB-IIB' in FIG. 2B.

In FIG. 2A, reference numeral 21 denotes a p-type silicon substrate. A tunnel oxide film 22 is formed on the p-type silicon substrate 21. The thickness of the tunnel oxide is 9 nm. A floating gate electrode 23 made of a polysilicon film whose thickness is 150 nm is formed on the tunnel oxide film 22. On the floating gate electrode 23, an NON film 27 formed by stacking a silicon nitride film 24, a silicon oxide film 25, and silicon nitride 26 in this order is formed. As shown in FIG. 2A, a source region 31 and a drain region 32, made of an n-type diffused layer, are formed in the element region of the silicon substrate 21, locating at the two sides of the floating gate electrode 33. A low-temperature oxide film (TEOS film) 19 is buried on the source region 31 and the drain region 32. A control gate electrode 28 made of a polysilicon film is formed on the NON film 27. Side oxide films 29 are formed on the side surfaces of the floating gate electrode 23 and the control gate electrode 28. As showing in FIG. 2B, a tungsten silicide layer 30 is formed on the surface of the control gate electrode 28 including the surface of an upper end portion 29a of the side oxide film 29 formed on the side surface of the control gate electrode 28.

A non-volatile semiconductor memory device 20 with the above arrangement is manufactured as follows.

As shown in FIG. 3A, a tunnel oxide film 22 is formed on the surface of the p-type silicon substrate 21 by the combination of oxidation at 800° C. in an $H_2/O_2$ atmosphere and oxynitrization at 950° C. in an $N_2O$ atmosphere.

Figure 3B:
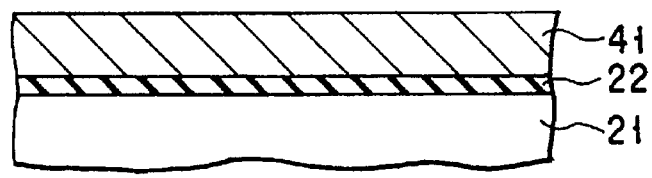

Subsequently, as in FIG. 3B, on the tunnel oxide film 22 a polysilicon film 41 as the floating gate electrode 23 is formed to have a film thickness of 150 nm by low-pressure CVD at 630° C. using $SiH_4$ gas as a source gas. Phosphorus is doped in the polysilicon film 41 by ion implantation (30 KeV, 7E14/cm$^2$).

Figure 3C:
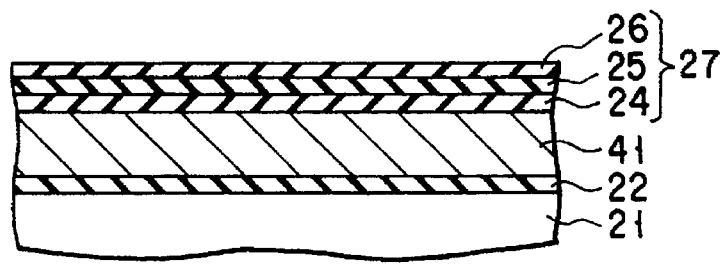

As shown in FIG. 3C, a silicon nitride film 24 with a film thickness of 8 nm is formed on the polysilicon film 41 by low-pressure CVD at 750° C. using $SiH_2Cl_2$ gas and $NH_3$ gas as source gases. A silicon oxide film 25 with a film thickness of 8 nm is then formed by CVD at 800° C. using $SiH_4$ gas and $N_2O$ gas as source gases. Finally, a silicon nitride film 26 with a film thickness of 8 nm is formed by low-pressure CVD at 750° C. using $SiH_2Cl_2$ gas and $NH_3$ gas as source gases. By the above process, the NON film 27 is formed.

Figure 3D:
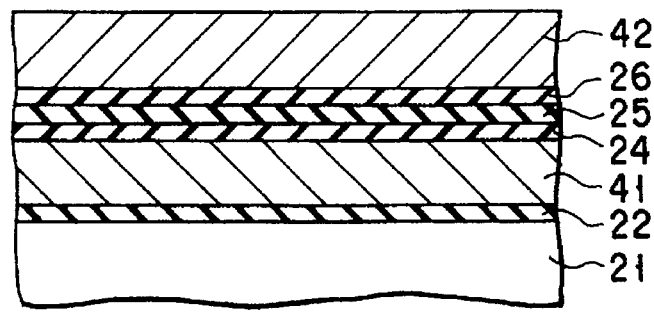

Subsequently, as illustrated in FIG. 3D, on the NON film 27 a polysilicon film 42 as the control gate electrode 28 is formed to have a film thickness of 80 nm by low-pressure CVD at 630° C. using $SiH_4$ gas as a source gas.

Figure 4A:
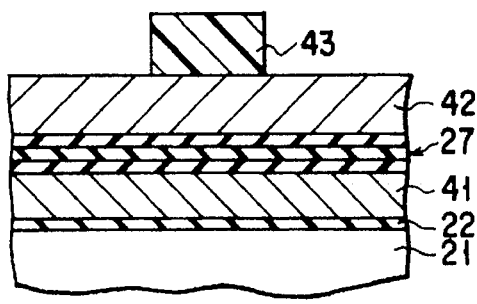
FIGS. 4A to 4D are sectional views showing the individual steps of the method of manufacturing the non-volatile semiconductor memory device of the first embodiment.

As shown in FIG. 4A, a resist pattern 43 having the shape corresponding to the floating gate electrode 23 and the control gate electrode 28 is formed on the polysilicon film 42 by a conventional photolithography process. Thereafter, this resist pattern 43 is used to pattern the resultant structure by RIE using $Cl_2$/HBr gas for the polysilicon films 41 and 42 and $CHF_3$ gas for the NON film 27.

Figure 4B:
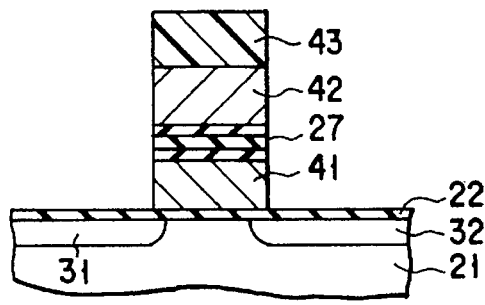

Subsequently, as shown in FIG. 4B, arsenic (As) is implanted (30 KeV, 4E15/cm$^2$) into the element regions of the silicon substrate 21, forming the source region 31 and the drain region 32.

Figure 4C:
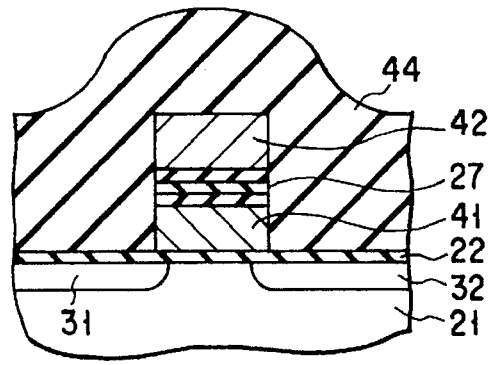
Figure 4D:
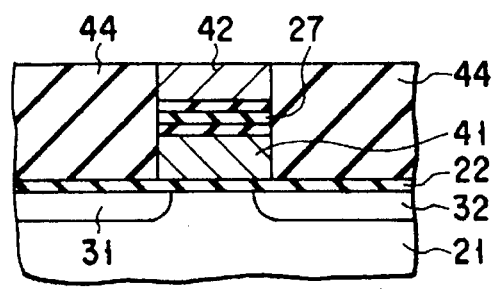

After the resist pattern 43 is removed, as in FIG. 4C, a TEOS film 44 whose thickness is 300 nm is formed by low-pressure CVD at 740° C. over the silicon substrate 21. The TEOS film 44 is then planarized by, for example, etch-back. Consequently, this TEOS film 44 is buried on the surfaces of the source region 31 and the drain region 32, and the surface of the polysilicon film 42 as the control gate electrode 28 is exposed.

Figure 5A:
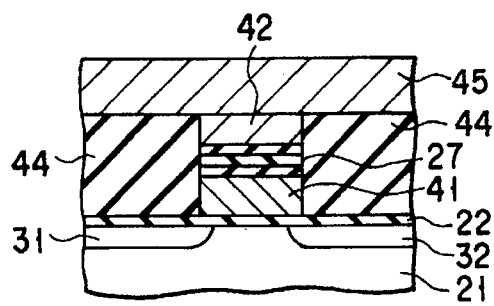
FIGS. 5A and 5B are sectional views showing the individual steps of the method of manufacturing the non-volatile semiconductor memory device of the first embodiment.
Figure 5B:
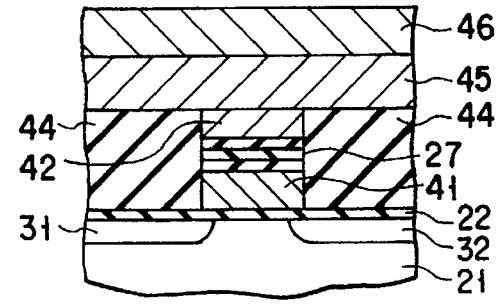

As illustrated in FIG. 5A, on the surface of the TEOS film 44 including the surface of the polysilicon film 42, a polysilicon film 45 having thickness of 120 nm is formed by low-pressure CVD at 630° C. using $SiH_4$ gas as a source gas. Phosphorus is doped at 875° C. using $POClP_3$. On the surface of the polysilicon film 45 shown in FIG. 5B, a tungsten silicide film 46 having thickness of 200 nm is formed by CVD at 450° C. using $WF_6$ gas and $SiH_2Cl_2$ gas as illustrated in FIGS. 6A and 6B.

Figure 6A:
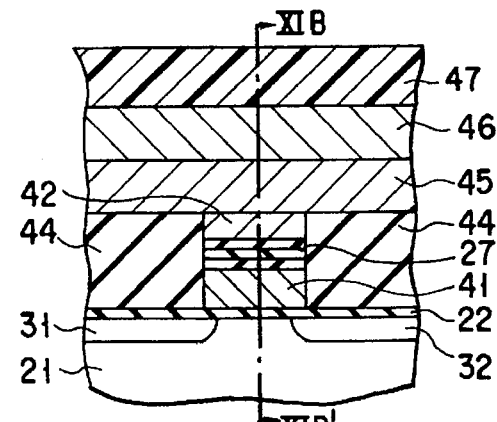
FIG. 6A is a sectional view showing the step of the method of manufacturing the non-volatile semiconductor memory device of the first embodiment and FIG. 6B is a sectional view corresponding to the line VIB–VIB' in FIG. 6A.
Figure 6B:
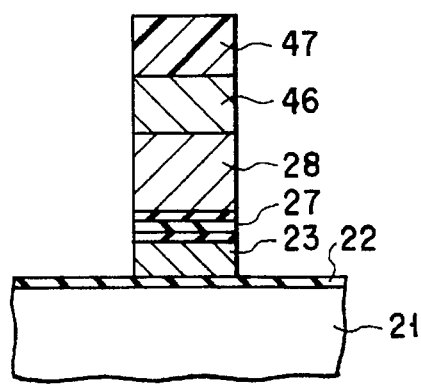

Thereafter, as in shown FIGS. 6A and 6B, a resist pattern 47 having the shape corresponding to the floating gate electrode 23 and the control gate electrode 28 is formed on the tungsten silicide film 46 by using a photolithography process. This resist pattern 47 is used to pattern the resultant structure by RIE using an $SF_6$/HBr gas mixture for the tungsten silicide film 46, $Cl_2$/HBr gas for the polysilicon film 45, and $CHF_3$ gas for the NON film 27.

Finally, annealing is performed in an oxygen atmosphere at 875° C. to form the side oxide films 29 on the side surfaces of the polysilicon films 41 and 42, thereby completing the non-volatile semiconductor memory device 20.

In the non-volatile semiconductor memory device 20 with the above configuration, the second gate insulating film for insulating the floating gate electrode 23 and the control gate electrode 28 from each other is made of the NON film 27. Therefore, the silicon oxide film 25 does not directly contact the polysilicon film 41 as the floating gate electrode 23 and the polysilicon film 42 as the control gate electrode 28. The silicon nitride films 24 and 26 are present between the film 25 and the films 41 and 42, respectively. Consequently, in the formation of the side oxide film 29 no silicon oxide grows inward along the interfaces between the silicon nitride films 24 and 25 and the polysilicon films 41 and 42 to form a gate birds' beaks. This prevents a decrease in the charge capacity of the floating gate electrode 23, which is brought about by the formation of a birds' beak, and hence a reduction in the coupling ratio. The result is that a memory cell transistor having good characteristics can be obtained.

Additionally, the dielectric constant of the silicon nitride film is about twice that of the silicon oxide film. Accordingly, the NON film 27 having thicknesses of 8 nm/8 nm/8 nm in the non-volatile semiconductor memory device 20 corresponds to a silicon oxide film with a thickness of 16 nm. Thicknesses of an ONO film corresponding to this silicon oxide film are, for example, 6 nm/8 nm/6 nm. Therefore, it is necessary to uniformly form a silicon oxide film thinner than the NON film 27 of the present invention. In contrast, the NON film 27 can be formed with a larger thickness. This allows an advantageous mass-production of the non-volatile semiconductor memory device 20.

The second embodiment of the non-volatile semiconductor memory device of the present invention will be described below.

Figure 7A:
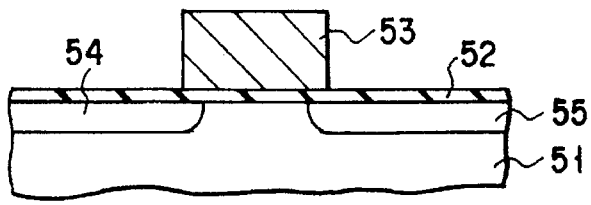
FIGS. 7A and 7B are sectional views showing the individual steps of a method of manufacturing a non-volatile semiconductor memory device of the second embodiment.

As illustrated in FIG. 7A, a tunnel oxide film 52 is formed on a p-type silicon substrate 51 in the same manner as in the first embodiment. A polysilicon film 53 having thickness of 150 nm is formed on the surface of the tunnel oxide film 52 by low-pressure CVD, and patterned. Phosphorus is then implanted to form a source region 54 and a drain region 53, made of an n-type diffused layer, locating at the two sides of the polysilicon film 53.

Figure 7B:
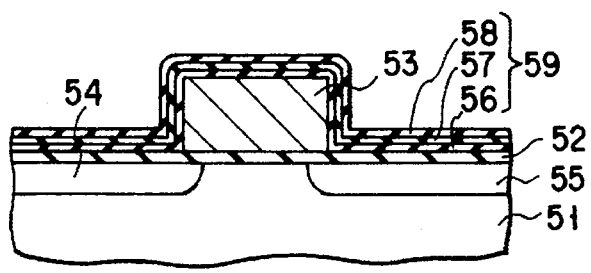

Subsequently, as illustrated in FIG. 7B, a silicon nitride film 56 having thickness of 8 nm is deposited on the surface of the tunnel oxide film 52 including the polysilicon film 53 by low-pressure CVD at 750° C. using $SiH_2Cl_2$ gas and $NH_3$ gas as source gases. A silicon oxide film 57 having thickness of 8 nm is then formed by CVD at 800° C. using $SiH_4$ gas and $N_2O$ gas as source gases. Finally, a silicon nitride film 58 having thickness of 8 nm is formed by low-pressure CVD at 750° C. using $SiH_2Cl_2$ gas and $NH_3$ gas as source gases. By these processes, an NON film 59 is formed.

Figure 8A:
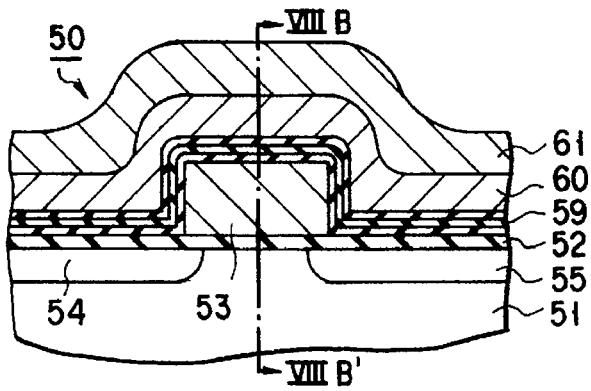
FIG. 8A is a sectional view showing the step of the method of manufacturing the non-volatile semiconductor memory device of the second embodiment and FIG. 8B is a sectional view corresponding to the line VIIIB–VIIIB' in FIG. 8A.
Figure 8B:
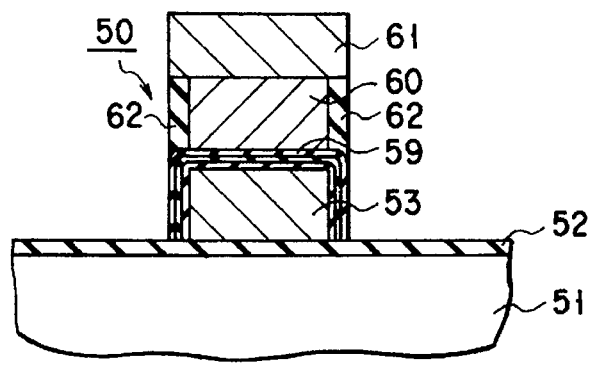

Thereafter, as shown in FIGS. 8A and 8B, a polysilicon film 60 having thickness of 200 nm is formed on the NON film 59 by low-pressure CVD and phosphorus is doped in the film by ion implantation. A tungsten silicide layer 61 having thickness of 200 nm is then formed on the polysilicon film 60 by CVD.

Subsequently, a resist pattern is formed on the surface of the tungsten silicide layer 61 by using a photolithography process. This resist pattern is used to pattern the resultant structure by RIE using $SF_6$/HBr gas for the tungsten silicide film 61, $Cl_2$/HBr gas for the polysilicon film 60, and $CHF_3$ gas for the NON film 59. Additionally, as shown in FIG. 8B, annealing is performed at 875° C. in an oxygen atmosphere to form side oxide films 62 on the side surfaces of the polysilicon 60, completing a non-volatile semiconductor memory device 50. This modification achieves the same effect as in the first embodiment.

Figure 9:
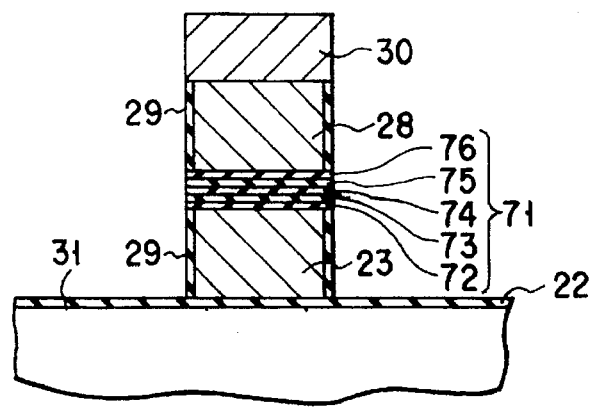
FIGS. 9 to 11 are sectional views showing modifications of the non-volatile semiconductor memory device according to the present invention.

FIG. 9 is a sectional view showing a modification of the non-volatile semiconductor memory device of the present invention. In FIG. 9, the same reference numerals as in the non-volatile semiconductor memory device of the first embodiment, FIG. 2B, denote the same parts, and a detail description thereof will be omitted. Referring to FIG. 9, a second gate insulating film 71 for insulating a floating gate 23 and a control gate 28 from each other has a five-layer structure formed by stacking, in the order named, from the floating gate 23 side, a silicon nitride film 72, a silicon oxide film 73 (SiO$_2$), a silicon nitride film 74 (Si$_3$N$_4$), a silicon oxide film 75 (SiO$_2$), and a silicon nitride film 76 (Si$_3$N$_4$). This modification achieves the same effect as in the above embodiments.

Figure 10:
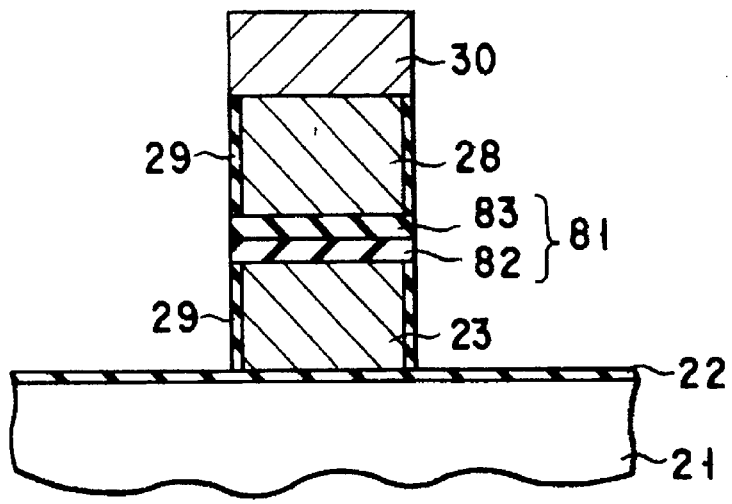

FIG. 10 is a sectional view showing a modification of the non-volatile semiconductor memory device of the present invention. In FIG. 10, the same reference numerals as in the non-volatile semiconductor memory device of the first embodiment, FIG. 2B, denote the same parts, and detail description thereof will be omitted. Referring to FIG. 10, a second gate insulating film 81 has a two-layer structure formed by stacking a silicon oxynitride film 82 and a silicon nitride film 83 in this order. The silicon oxynitride film 82 has Si-N bonds at the interface with polysilicon of the floating gate electrode 23. In the other words, the silicon oxynitride film 82 is a silicon oxide film piled up nitrogen atoms. The silicon oxynitride film 82 can be formed by annealing polysilicon of the floating gate electrode 23 in an N$_2$O gas atmosphere. This modification achieves the same effect as in the first embodiment.

Figure 11:
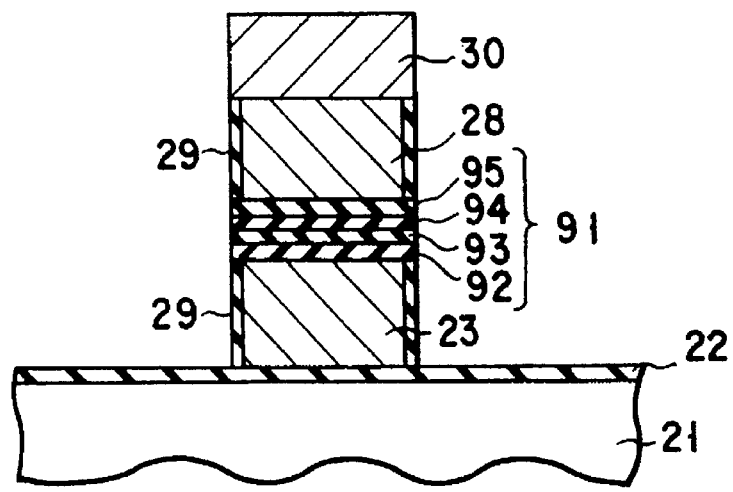

FIG. 11 is a sectional view showing a modification of the non-volatile semiconductor memory device of the present invention. In FIG. 11, the same reference numerals as in the non-volatile semiconductor memory device of the first embodiment, FIG. 2B, denote the same parts, and a detail description thereof will be omitted. Referring to FIG. 11, a second gate insulating film 91 has a four-layer structure formed by stacking a silicon oxynitride film 92, a silicon nitride film 93, a silicon oxide film 94 and a silicon nitride film 95 in this order. The silicon oxynitride film 92 has Si-N bonds at the interface with polysilicon of the floating gate electrode 23. In the other words, the silicon oxynitride film 92 is a silicon oxide film piled up nitrogen atoms. This stacked structure can be formed according with the method (6) describe above. This modification achieves the same effect as in the above embodiments.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a non-volatile semiconductor memory device comprising the steps of:

forming a first gate insulating film on a semiconductor substrate having one conductivity type;

forming a first polysilicon film on said first gate insulating film;

forming a second gate insulating film by sequentially stacking a silicon nitride film, a silicon oxide film, and a silicon nitride film on the surface of said first polysilicon film, said second gate insulating film having Si-N bonds at an interface with a floating gate electrode and at an interface with a control gate electrode;

forming a second polysilicon film on said second gate insulating film;

patterning said first polysilicon film to form said floating gate electrode said second gate insulating film, and said second polysilicon film to form said control gate electrode formed on said first gate insulating film;

doping impurities into element regions of said semiconductor substrate on two sides of said floating gate electrode to form source and drain regions having a conductivity type opposite to the conductivity type of said semiconductor substrate; and forming a side insulating film on side surfaces of said floating gate electrode and said control gate electrode.

2. A method of manufacturing a non-volatile semiconductor memory device, compromising the steps of:

forming a first gate insulating film on a semiconductor substrate having one conductivity type;

forming a first polysilicon film on said first gate insulating film;

forming a second gate insulating film by sequentially stacking a silicon nitride film, a silicon oxide film, a silicon nitride film, a silicon oxide film, and a silicon nitride film on the surface of said first polysilicon film, said second gate insulating film having Si-N bonds at an interface with a floating gate electrode and at an interface with a control gate electrode;

forming a second polysilicon film on said second gate insulating film;

patterning said first polysilicon film to form said floating gate electrode said second gate insulating film, and said second polysilicon film to form said control gate electrode said second gate insulating film, and said second polysilicon film formed on said first gate insulating film;

doping impurities into element regions of said semiconductor substrate on two sides of said floating gate electrode to form source and drain regions having a conductivity type opposite to the conductivity type of said semiconductor substrate; and forming a side insulating film on side surfaces of said floating gate electrode and said control gate electrode.

3. A method according to claim 1 or 2, wherein said silicon nitride films are formed by CVD.

4. A method according to claim 1 or 2, wherein said silicon nitride films are formed by annealing silicon oxide films in a nitrogen atmosphere.

5. A method according to claim 1, wherein said second gate insulating film is formed by annealing said first polysilicon film in an atmosphere containing nitrogen atoms and oxygen atoms to form a silicon oxynitride film in which nitrogen atoms are piled up on an interface between silicon and silicon oxide, and forming a silicon nitride film on said silicon oxynitride film.

6. A method according to claim 1, wherein said second gate insulating film is formed by annealing said first polysilicon film in an atmosphere containing nitrogen atoms and oxygen atoms to form a silicon oxynitride film in which nitrogen atoms are piled up on an interface between silicon and silicon oxide, and sequentially forming a silicon nitride film, a silicon oxide film, and a silicon nitride film on said silicon oxynitride film.

7. A method of manufacturing a non-volatile semiconductor memory device, comprising the steps of:

forming a first gate insulating film on a semiconductor substrate having one conductivity type;

forming a first polysilicon film on said first gate insulating film;

forming a second gate insulating film on said first polysilicon film, wherein said second gate insulating film is formed by forming a silicon oxide film on said first polysilcon film, annealing said silicon oxide film in an atmosphere containing nitrogen atoms and oxygen atoms to form a silicon oxynitride film in which nitrogen atoms are piled up on an interface between silicon and silicon oxide, and forming a silicon nitride film on said silicon oxynitride film, said second gate insulating film having Si-N bonds at an interface with a floating gate electrode formed from said first polysilicon film and a control gate electrode formed from a second polysilicon film;

forming said second polysilicon film on said second gate insulating film;

patterning said first polysilicon film to form said floating gate electrode, said second gate insulating film, and said second polysilicon film to form said control gate electrode on said first gate insulating film;

doping impurities into element regions of said semiconductor substrate on two sides of said floating gate electrode to form source and drain regions having a conductivity type opposite to the conductivity type of said semiconductor substrate; and forming a side insulating film on side surfaces of said floating gate electrode and said control gate electrode.

* * * * *